United States Patent
Silver et al.

(10) Patent No.: US 8,319,846 B2
(45) Date of Patent: Nov. 27, 2012

(54) VIDEO CAMERA SYSTEM USING MULTIPLE IMAGE SENSORS

(75) Inventors: Alan G. Silver, Allen, TX (US); Michael C. Menefee, Richardson, TX (US)

(73) Assignee: Raytheon Company, Waltham, MA (US)

( * ) Notice: Subject to any disclaimer, the term of this patent is extended or adjusted under 35 U.S.C. 154(b) by 1483 days.

(21) Appl. No.: 11/622,417

(22) Filed: Jan. 11, 2007

(65) Prior Publication Data
US 2008/0170140 A1 Jul. 17, 2008

(51) Int. Cl.
 *H04N 5/225* (2006.01)
 *H04N 7/00* (2011.01)
(52) U.S. Cl. ................ 348/218.1; 348/38
(58) Field of Classification Search ........... 348/29–280, 348/294, 340, 342, 274–27
See application file for complete search history.

(56) References Cited

U.S. PATENT DOCUMENTS

| | | | | |
|---|---|---|---|---|
| 5,801,373 A * | 9/1998 | Oozu et al. | | 250/208.1 |
| 7,199,348 B2 * | 4/2007 | Olsen et al. | | 250/208.1 |
| 7,710,463 B2 * | 5/2010 | Foote | | 348/218.1 |
| 8,049,806 B2 * | 11/2011 | Feldman et al. | | 348/340 |
| 2003/0011888 A1 * | 1/2003 | Cox et al. | | 359/626 |
| 2003/0048360 A1 * | 3/2003 | Herley | | 348/222.1 |
| 2003/0232461 A1 * | 12/2003 | Bolken et al. | | 438/106 |
| 2004/0036785 A1 * | 2/2004 | Takayanagi | | 348/308 |
| 2005/0212939 A1 | 9/2005 | Oda et al. | | 348/311 |
| 2005/0225654 A1 * | 10/2005 | Feldman et al. | | 348/272 |
| 2006/0054787 A1 * | 3/2006 | Olsen et al. | | 250/208.1 |
| 2006/0268360 A1 * | 11/2006 | Jones | | 358/448 |
| 2006/0274921 A1 * | 12/2006 | Rowe | | 382/124 |
| 2007/0103585 A1 * | 5/2007 | Takeuchi et al. | | 348/441 |

FOREIGN PATENT DOCUMENTS
WO WO 99/26419 5/1999
WO WO 02/49367 6/2002

OTHER PUBLICATIONS

A wavelet-Based image fusion tutorial. Apr. 22, 2004 Available @ www.ElsevierComputerscience.com.*
PCT; International Search Report and Written Opinion; (IS/EPO) for PCT/US2007/0881147 (12 pages), May 7, 2008.
Communication Pursuant to Article 94(3) EPC for Application No. 07 871 709.7-2202 (2 pages), Dec. 21, 2009.
European Patent Office Communication pursuant to Article 94(3) EPC, re Application No. 07 871 709.7-2202 dated Dec. 6, 2010.

* cited by examiner

*Primary Examiner* — Chieh M. Fan
*Assistant Examiner* — Ahmed A Berhan
(74) *Attorney, Agent, or Firm* — Lando & Anastasi, LLP

(57) ABSTRACT

According to one embodiment of the present disclosure, a system for generating a reconstructed image generally includes a carrier substrate, a number of image sensors, and an image processing circuit. The image sensors are mounted on a surface of the carrier substrate. The image processing circuit is coupled to each of the image sensors and operable to receive a raw image from each of a plurality of image sensors and combine the raw image of each of the image sensors into the reconstructed image.

21 Claims, 2 Drawing Sheets

VIDEO CAMERA SYSTEM USING MULTIPLE IMAGE SENSORS

TECHNICAL FIELD OF THE DISCLOSURE

This disclosure generally relates to video camera systems, and more particularly, to a video camera system using multiple image sensors and method of operating the same.

BACKGROUND OF THE DISCLOSURE

One example of an image sensor is a device for converting various forms of light energy into an electrical signal representative of an image. In typical video camera systems, the image sensor may be configured proximate the focal point of a lens in order to focus light within the lens's field of view. One particular type of video camera system that has become useful is a night vision video camera. Night vision cameras have become particularly useful for enhanced view at night where visible light may not be sufficient. Night vision video cameras make use of infrared radiation emanating from objects within a lens's field of view in order to generate a viewable raster image.

SUMMARY OF THE DISCLOSURE

According to one embodiment of the present disclosure, a system for generating a reconstructed image generally includes a carrier substrate, a number of image sensors, and an image processing circuit. The image sensors are mounted on a surface of the carrier substrate. The image processing circuit is coupled to each of the image sensors and operable to receive a raw image from each of a plurality of image sensors and combine the raw image of each of the image sensors into the reconstructed image.

Embodiments of the invention may provide numerous technical advantages. Some, none, or all embodiments may benefit from the below described advantages. According to one embodiment, one technical advantage may be a video camera system that is relatively smaller in physical size than comparable known video camera devices having comparable output resolution. This relative reduction in size may be due to several factors. One factor may be the implementation of a number of lenses having smaller size, thus having a correspondingly smaller focal point. Another factor may be the implementation of a hardware compression technique that may reduce the processing requirements of the associated image processing circuit. This reduction in processing requirement may serve to reduce power requirements and thus the size and weight of associated batteries.

Other technical advantages will be apparent to one of skill in the art.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS OF THE DISCLOSURE

Embodiments of the present disclosure and its advantages are best understood by referring to FIGS. 1A through 3 of the drawings, like numerals being used for like and corresponding parts of the various drawings.

Image sensors may measure the relative luminous intensity at various regions across its surface in order to generate an image. In order to function properly, lenses used with these video cameras should be sufficiently large in order to provide the proper amount of luminous intensity. The focal point of the lens however, is conventionally directly proportional to the size of the lens. Thus, the need for relatively large lenses in video cameras have limited the reduction in size and weight that the video camera may be designed to have.

Figure 1A:
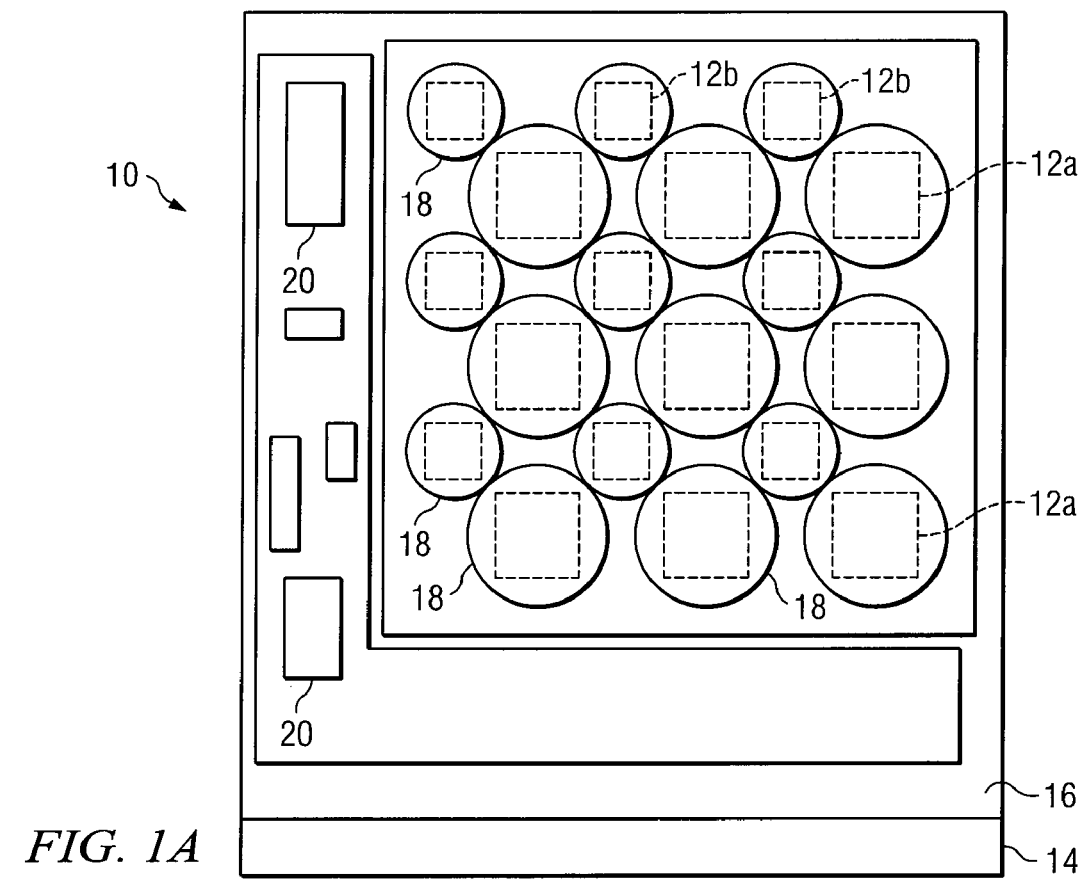
FIG. 1A is a plan view of one embodiment of a video camera system using multiple image sensors according to the present disclosure.

FIG. 1A shows one embodiment of a video camera system 10 that may overcome the size reduction constraints of known video camera systems. Video camera system 10 generally includes a plurality of image sensors 12a and 12b that are mounted to the surface 16 of a carrier substrate 14. Each of the image sensors 12 has a corresponding lens 18 that serves to focus light from objects within the image sensor's field of view. Sufficient luminous intensity is provided by the plurality of image sensors 12. As will be described in detail below, the relatively small size of the lens 18 allows for a corresponding relatively close placement to the image sensors 12. Thus, video camera system 10 may be relatively smaller in size than known video camera systems, yet with comparable performance. As will be described in greater detail below, image sensors 12a may be operable to detect light from a color range that is different than image sensors 12b.

Carrier substrate 14 may be formed of any generally rigid material that maintains the image sensors 12 in a generally fixed relation relative to one another. In one embodiment, carrier substrate 14 may include an image processing circuit 20 for receiving and processing signals from the image sensors 12. In another embodiment, image processing circuit 20 may be integrally formed on carrier substrate 14 using a known planar process. Image processing circuit 20 may be any electrical circuit suitable for receiving at least a portion of information from the plurality of image sensors 12a and 12b, such as a computer processor, a field programmable gate array (FPGA), an application specific integrated circuit (ASIC), or the like. In one embodiment, image processing circuit 20 may be a read out integrated circuit (ROIC) that is configured to couple information provided by image sensors 12a and 12b to external electronics. In another embodiment, image processing circuit 20 may be operable to perform hardware and/or software compression algorithms in order to form a reconstructed image at a smaller processing rate than the processing rate required by the raw images themselves.

Image sensors 12 are formed independently from carrier substrate 14 and thus, may be formed of a different material from which the carrier substrate 14 is formed. The image sensors 12 may be mounted to carrier substrate 14 using any suitable bonding approach, such as adhesives, ultrasonic bonding techniques, solder bonding mechanisms, or the like. Image sensors 12 may be formed from any material suitable for detection of light energy in any desired color range. For example, image sensors 12a or 12b formed of Gallium-Arsenide (GaAs) may be used to detect light energy in the short wavelength infrared (SWIR) range. Image sensors 12 formed of indium-antimony (InSb) or mercury-cadmium-tellurium (HgCdTe) may be used to detect light energy in the mid wavelength infrared (MWIR) range and long wavelength infrared (LWIR) range. Image sensors 12 formed of silicon (Si) may be used to detect light energy in the very long wavelength infrared (VLWIR) range.

Certain embodiments of the present invention in which the image sensors 12a and 12b are formed independent of the carrier substrate 14 may provide an advantage in that the image sensors 12a and 12b may be formed of a different material than the material from which the carrier substrate is formed. For example, carrier substrate 14 may be formed from silicon that is a relatively inexpensive material and highly suited for implementation of the image processing circuit 20 that is used to process signals from the image sensors 12a and 12b. Another advantage may be provided in that varying types of image sensors 12a and 12b may be mixed together in order to enable reception and processing of light energy from differing color ranges. In the particular embodiment shown, carrier substrate 14 has one subset of image sensors 12a formed of HgCdTe for reception of long wavelength infrared light and another subset of image sensors 12b formed of InSb for reception of medium wavelength infrared light. Thus, image sensors 12 may be formed of any material suitable for a particular desired wavelength of reception, such as near infrared, short wavelength infrared, mid wavelength infrared, long wavelength infrared, far infrared, and visible light.

The present illustration shows a video camera system 10 implemented with two differing types of image sensors 12a and 12b; however, it is contemplated that differing types of image sensors 12 of any quantity may be implemented according to the teachings of the present disclosure, such as three or more types of image sensors 12. For example, image sensors 12 configured for use with the video camera system 10 may be operable to detect light energy in the near infrared, short wavelength infrared, mid wavelength infrared, long wavelength infrared, far infrared, and visible light ranges, thereby utilizing a total of six differing types of image sensors 12. As will be described in greater detail below, the image processing circuit 20 may be operable to combine information provided by each of these differing types of image sensors 12 in order to enhance the visual information provided to a user.

In the particular embodiment shown, the first subset of image sensors 12a and second subset of image sensors 12b each have a quantity of nine image sensors. However, it should be appreciated that each subset of image sensors 12a or 12b may each comprise any quantity of image sensors 12. In this manner, varying types of image sensors 12a or 12b may be mixed or matched in any quantity to suit any foreseeable type of lighting condition that may be encountered during use.

Figure 1B:
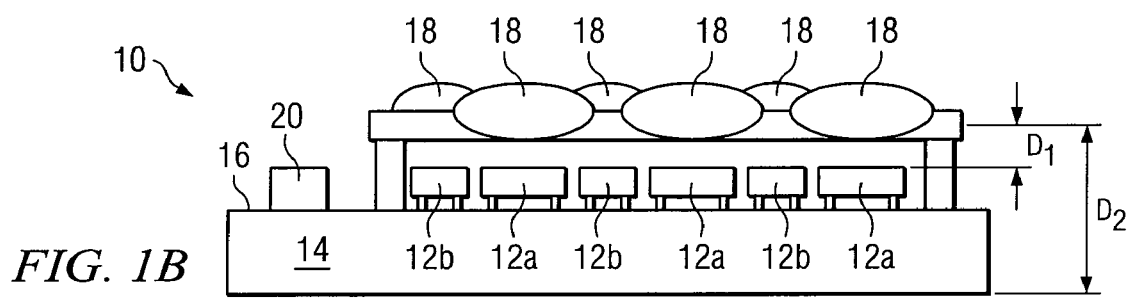
FIG. 1B is a side elevational view of the embodiment of FIG. 1.

FIG. 1B is a side elevational view of the embodiment of FIG. 1A showing the arrangement of each lens 18 with respect its corresponding image sensor 12a and 12b. As described previously, the relatively small size of the lenses 18 provides for a proportionally small focal length. Thus, the depth $D_1$ of the lenses 18 to the image sensors 12a and 12b may be relatively short, thereby enabling an overall depth $D_2$ that is relatively shorter than known video camera systems, yet with comparable performance.

In one embodiment, particular subsets of the lenses 18 may have varying focal lengths relative to one another in order to enhance the depth of field of the reconstructed image. For example, a first subset of lenses 18 may have a focal length that is suited to focus light energy from objects at a relatively far distance and a second subset of lenses 18 that have a focal length for focusing light energy from objects at relatively near distances. The image processing circuit 20 may be operable to combine raw images from each of these subsets of image sensors 12 such that the overall depth of field is enhanced.

In another embodiment, particular subsets of lenses 18 may be polarized in order to reduce unwanted glare. For example, one subset of lenses 18 having a linear or circular polarization characteristic such that light energy incident at an oblique polarization may be refracted away from its respective image sensor 12a or 12b. This subset of lenses 18 may be used with other subsets of lenses 18 having a differing polarization characteristics, such as linear, circular, or no polarization in order to minimize glare on the reconstructed image.

Figure 1C:
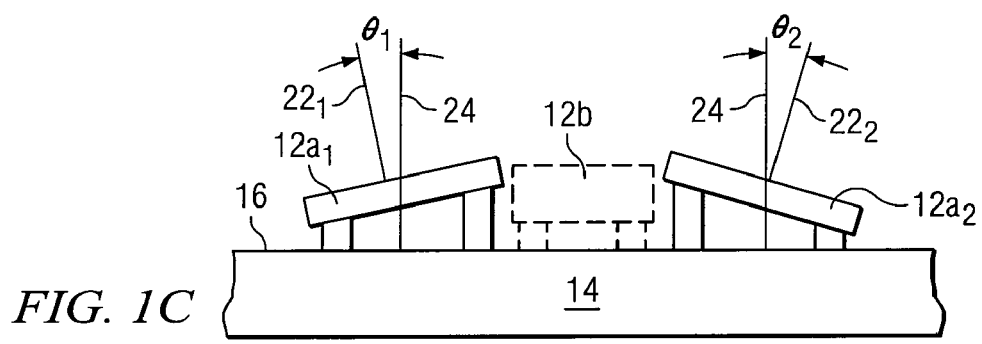
FIG. 1C is an enlarged, partial, side elevational view of the embodiment of FIG. 2.

FIG. 1C is an enlarged, partial, elevational view of FIG. 1B showing one embodiment of the orientation of image sensors $12a_1$ and $12a_2$ relative to each other and to the carrier substrate 14. An image sensor 12b is shown in phantom lines. Each of the image sensors $12a_1$ and $12a_2$ has an axis $22_1$ and $22_2$ that is central to the field of view of its particular image sensor $12a_1$ and $12a_2$. In this particular embodiment, the axis $22_1$ and $22_2$ of each image sensor $12a_1$ and $12a_2$ is oriented at an angle $\theta_1$ and $\theta_2$ relative to the geometric normal 24 of the carrier substrate 14. The angles $\theta_1$ and $\theta_2$ formed between the axes $22_1$ and $22_2$ and geometric normal 24 may be generally random in order to aid processing of the reconstructed image by image processing circuit 20. By orienting image sensors 12a at various orientations relative to one another, particular image sensors 12a may be able to derive visual information that was not obtained by the other image sensors 12a. For example, individual pixels derived by image sensor 12a1 may include image information that is not obtained by a pixilated raw image derived by image sensor 12a2. That is, the pixels derived by image sensor 12a1 may be interleaved with the pixels of image sensor 12a2. The angles $\theta_1$ and $\theta_2$ formed between the axes 22 and geometric normal 24 may be randomly distributed to be between 0 and 0.5 degrees.

Figure 2A:
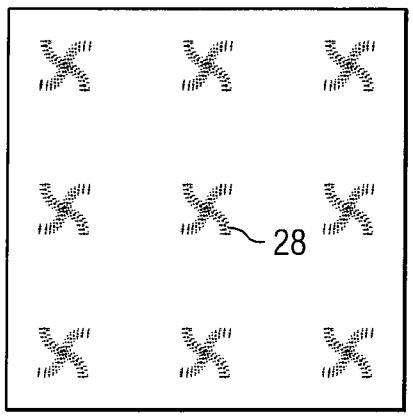
FIG. 2A is an illustration showing a number of raw images that may be produced by the embodiment of FIG. 1A.
Figure 2B:
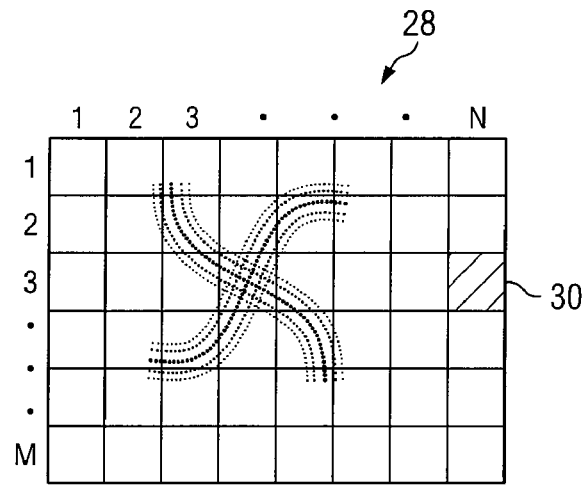
FIG. 2B is an illustration showing an enlarged view of one of the raw images of FIG. 2A.
Figure 2C:
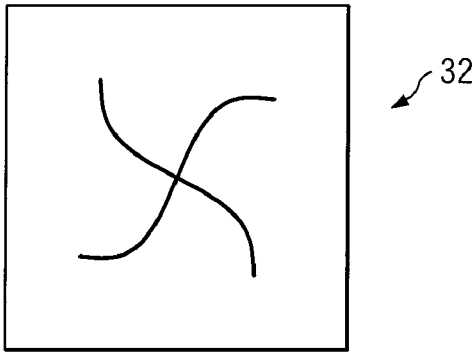
FIG. 2C is an illustration showing a reconstructed image that was produced from the raw images of FIG. 2A by the embodiment of FIG. 1A.

FIGS. 2A through 2C shows several illustrations indicating images that may be produced by the video camera system 10. FIG. 2A shows a number of raw images 28 that may be produced by image sensors 12a. The raw images 28 produced by image sensors 12a are shown, but raw images produced by image sensors 12b are not shown for purposes of clarity and brevity of disclosure. FIG. 2B is an illustration showing an enlarged view of one of the raw images 28 of FIG. 2A. The raw image 28 may be segmented into a number of blocks 30 arranged in a M number of rows by a N number of columns, thereby forming the raw image 28 having a height equal to M*(pixel size) and a width equal to N*(pixel size). Thus, blocks 30 may be a number of contiguous pixels of the raw image 28.

FIG. 2C is an illustration of a reconstructed image 32 that has been formed from the raw images 28 by image processing circuit 20. Reconstructed image 32 may include cumulative information provide by the plurality of raw images 28 in order to have a resolution comparable to images provided by known camera systems. That is, each of the raw images 28 may have a generally moderate resolution, but the image processing circuit 20 may be operable to combine each of the raw images 28 into the reconstructed images 32 having a resolution comparable to known video camera systems.

Figure 3:
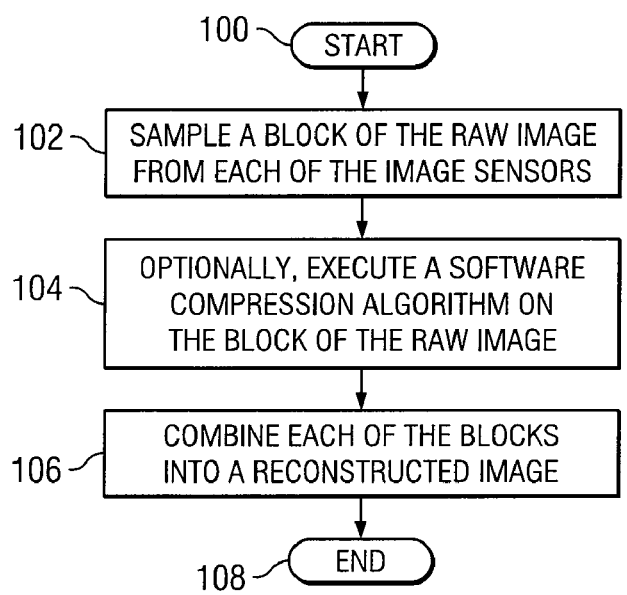
FIG. 3 is a flowchart depicting a series of actions that may be performed by the embodiment of FIG. 1A to combine the raw images into the reconstructed image.

FIG. 3 shows a series of actions that may be performed by image processing circuit 20 to produce the reconstructed image 32 from the raw images 28. In act 100, the video camera system 10 is initiated. The video camera system 10 may be initiated by applying electrical power to the image processing circuit 20 and image sensors 12. In a particular embodiment in which the image processing circuit 20 includes a computer processor, any necessary boot-strapping operations may be performed in order to initialize the computer processor for use.

In act 102, a portion of a raw image 28 may be transmitted from each of the image sensors 12 to the image processing circuit 20. In one embodiment, image sensors 12 may comprise two or more differing types of image sensors 12. In this manner, a reconstructed image 32 may be formed that includes information from a number of differing light ranges. In another embodiment, image sensors 12 may comprise a multiple number of image sensors 12 of the same type. Thus, multiple numbers of image sensors 12 may comprise a first subset of image sensors that are sensitive to a first color range and a second subset of image sensors that are sensitive to a second color range that is different from the second color range.

The cumulative portions of the raw images 28 that are combined in order to form the reconstructed image 32 may be less than all of the respective raw images 28. Certain embodiments of the present invention may provide an advantage in that transmission of only a portion of the raw images 28 may serve to reduce computations that may be performed by the image processing circuit 20. Thus, a relatively smaller image processing circuit 20 may be used in order to generate comparable image quality. An additional advantage that may be provided by reduced computational throughput may be a reduced amount of electrical power required to operate the video camera system 10, thus enabling a corresponding reduction in battery size in some embodiments.

Transmission of portions from each of the image sensors 12 may be generally referred to as hardware compression. Compression is generally referred to as an approach for reducing bandwidth or information rate of a signal while maintaining an acceptable level of information quality. Hardware compression may be referred to as a type of compression in which a portion of the raw image is transmitted from the image sensors 12 to the image processing circuit 20. Thus, hardware compression may refer to any approach of receiving information from the image sensors 12 for the purpose of reducing the information rate while maintaining an acceptable level of information quality.

In one embodiment, the portions of the raw images 28 may be sequentially transmitted from each of the image sensors 12 at a raw frame rate that is slower than a reconstruction frame rate. This process may be repeated continually during operation of the video camera system 10. In another embodiment, the portions of the raw images 28 may be transmitted using a coded random access sequence. A coded random access sequence is generally referred to as a process that may be performed repeatedly over differing blocks 30 of each of the raw images 28 such that visual information from each of the raw images 28 is received by the image processing circuit 20.

The portion may be any contiguous portion of the raw image 28. In one embodiment, the portion may be a single pixel from a particular raw image 28. In another embodiment, the portion may be a block 30, such as contiguous subset of pixels used to form the raw image 28.

In another embodiment, the relative position of each portion of one particular raw image is noncontiguous with a successively received portion of another raw image 28. For example, image processing circuit 20 may receive a block 30 at position coordinate (2, 3) from a first raw image 28 and subsequently receive another block 30 at position coordinate (6, 4) from another raw image 28. Certain embodiments of the present embodiments may provide an advantage in that portion of respective raw images 28 that are noncontiguous to one another may have a relatively higher degree of information than portion of raw images 28 that are contiguous to one another. In this manner, a relatively high rate of information may be provided for each portion of the raw image 28 received by the image processing circuit 20.

In act 104, an optional software compression algorithm may be performed on each of the portions of the raw images 28 by the image processing circuit 20. The software compression algorithm may serve to enhance the resolution of the reconstructed image 32 and/or provide further compression of the signal bandwidth of the reconstructed image 32. In one embodiment, a discrete wavelet transform (DWT) may be performed on the plurality of blocks 30 received by the image processing circuit 20. Algorithms using wavelet analysis may be ideally suited for processing of time-varying images, such as may be typically encountered with the video camera system 10.

In act 106, a reconstructed image 32 is generated by combining the transmitted portions of the raw images 28. In another embodiment, the image processing circuit 20 may be operable to combine the raw images 28 into the reconstructed image 32 using a constrained wavelet inference on a finite kernel space-time window. In this manner, information from the raw images 28 may be further compressed in order to further alleviate processing requirements of the image processing circuit 20.

The reconstructed image 32 may be supplied as a video output signal from the image processing circuit 20. The previously described actions of act 102 to act 106 may be repeatedly performed in order to produce the reconstructed image 32. Once usage of the reconstructed image 32 from the video camera system 10 is no longer needed or desired, the method described above may be halted by removal of electrical power from the image processing circuit 20 and associated image sensors 12 in act 108.

A video camera system 10 has been described that may provide performance comparable to, yet having a relatively shorter overall depth $D_2$ than other known video camera designs. Implementation of independently formed image sensors 12 onto a common carrier substrate 14 may also provide for mixing and matching of various sensor technologies into a relatively small physical package. A method for receipt and processing of information from each of these image sensors 12 has also been disclosed that may provide a type of hardware compression. Using hardware compression, an image processing circuit 20 and its associated algorithms may be implemented that are not computationally intensive, thus alleviating processing requirements as well as electrical power requirements to operate the video camera system 10.

Although the present invention and its advantages have been described in detail, it should be understood that various changes, substitutions, and alterations can be made therein without departing from the spirit and scope of the invention as defined by the appended claims.

What is claimed is:

1. A plurality of image sensors that are mounted to a surface of the carrier substrate, the surface having a geometric normal, each of the plurality of image sensors having a field of view and an axis central to the field of view, the axis forming a random angle with respect to the geometric normal, the random angle being in a range of between 0 and 0.5 degrees, the carrier substrate being formed from a substrate material that is different from a sensor material from which the plurality of image sensors are formed, the plurality of image sensors comprising a first subset of image sensors that are sensitive to a first color range and a second subset of image sensors that are sensitive to a second color range, the first color range being different from the second color range, the first color range and second color range each selected from the group consisting of: near infrared, short wavelength infrared, mid wavelength infrared, long wavelength infrared, very long wavelength infrared, and a visible light color range; a lens disposed proximate each of the plurality of image sensors; and an image processing circuit coupled to each of the plurality of image sensors and operable to: receive a raw image from each of a plurality of image sensors using hardware compression; and combine the raw image of each of the plurality of image sensors into the reconstructed image.

2. The system of claim 1, the first subset of image sensors being a first plurality of image sensors, and the second subset of image sensors being a second plurality of image sensors.

3. A carrier substrate; a plurality of image sensors mounted to a surface of the carrier substrate, the plurality of image sensors comprising a first subset of image sensors that are sensitive to a first color range and a second subset of image sensors that are sensitive to a second color range, wherein each of the plurality of image sensors has a field of view with an axis central to the field of view, the axis of each of the plurality of image sensors forming an angle with respect to a geometric normal of the surface that is different from one another, the angles of the plurality of image sensors being randomly distributed between 0 and 0.5 degrees; a plurality of lenses, each lens being disposed proximate a respective one of the plurality of image sensors; and an image processing circuit coupled to each of the plurality of image sensors and operable to: receive a raw image from each of a plurality of image sensors; and combine the raw image of each of the plurality of image sensors into the reconstructed image.

4. The system of claim 3, wherein the carrier substrate being formed from a substrate material that is different from a sensor material from which the plurality of image sensors are formed.

5. The system of claim 3, the first color range being different from the second color range.

6. The system of claim 5, wherein the first color range and second color range are each selected from the group consisting of near infrared, short wavelength infrared, mid wavelength infrared, long wavelength infrared, very long wavelength infrared, and a visible light color range.

7. The system of claim 3, wherein the plurality of image sensors comprise at least three image sensor types, each image sensor type being sensitive to a color range that is different from one another.

8. The system of claim 3, the first subset of image sensors being a first plurality of image sensors and the second subset of image sensors being a second plurality of image sensors, wherein the plurality of lenses of the first plurality of image sensors have a focal length that is different from the focal length of the plurality of lenses of the second plurality of image sensors.

9. The system of claim 3, the first subset of image sensors being a first plurality of image sensors and the second subset of image sensors being a second plurality of image sensors, the plurality of lenses of the first plurality of image sensors having a polarization that is different from the polarization of the plurality of lenses of the second plurality of image sensors.

10. The system of claim 3, wherein the image processing circuit is further operable to receive a raw image from each of a plurality of image sensors using hardware compression.

11. The system of claim 3, wherein the image processing circuit is further operable to receive a block of a raw image from each of a plurality of image sensors, the block being a contiguous subset of pixels forming the raw image.

12. The system of claim 3, wherein the image processing circuit is further operable to receive a block of a raw image from each of a plurality of image sensors, the block being a single pixel forming the raw image.

13. The system of claim 3, the axis of each of the plurality of image sensors forming an angle with respect to a geometric normal of the surface that is different from one another.

14. A method for generating a reconstructed image comprising: transmitting, from each of a plurality of image sensors, a portion of a respective raw image to an image processing circuit, the plurality of image sensors comprising a first subset of image sensors that are sensitive to a first color range and a second subset of image sensors that are sensitive to a second color range, wherein a lens is disposed proximate each of the plurality of image sensors and each of the plurality of image sensors has a field of view with an axis central to the field of view, the axis of each of the plurality of image sensors forming an angle with respect to a geometric normal of the surface that is different from one another, the angles of the plurality of image sensors being randomly distributed between 0 and 0.5 degrees; and generating a reconstructed image by combining, by the image processing circuit, the transmitted portions, the transmitted portion of each respective one of the plurality of image sensors that is combined to generate the reconstructed image being less than all of the respective raw images.

15. The method of claim 14, wherein transmitting, from each of a plurality of image sensors, a portion of a respective raw image, further comprises transmitting, from each of a plurality of image sensors, a pixel of a respective raw image.

16. The method of claim 14, wherein transmitting, from each of a plurality of image sensors, a portion of a respective raw image, further comprises transmitting, from each of a plurality of image sensors, a contiguous block of pixels of a respective raw image.

17. The method of claim 14, wherein transmitting, from each of a plurality of image sensors, a portion of a respective raw image, further comprises transmitting, from each of a plurality of image sensors, a portion of a respective raw image at a raw frame rate that is slower than a reconstruction frame rate.

18. The method of claim 14, wherein transmitting, from each of a plurality of image sensors, a portion of a respective raw image, further comprises sequentially transmitting, from each of a plurality of image sensors, a portion of a respective raw image.

19. The method of claim 18, wherein sequentially transmitting, from each of a plurality of image sensors, a portion of a respective raw image, further comprises sequentially transmitting, from each of a plurality of image sensors, a portion of a respective raw image using a coded random access sequence.

20. The method of claim 14, wherein transmitting, from each of a plurality of image sensors, a portion of a respective raw image to an image processing circuit, further comprises transmitting, from each of a plurality of image sensors that are mounted to the surface of a carrier substrate, a portion of a respective raw image to an image processing circuit, the image processing circuit being integrally formed on the carrier substrate.

21. A method for generating a reconstructed image comprising: transmitting, from each of a plurality of image sensors disposed on a substrate surface, a portion of a respective raw image to an image processing circuit, the plurality of image sensors comprising a first subset of image sensors that are sensitive to a first color range and a second subset of image sensors that are sensitive to a second color range, wherein a lens is disposed proximate each of the plurality of image sensors, each of the plurality of image sensors having a field of view and an axis central to the field of view, each axis forming a random angle with respect to a geometric normal of the substrate surface, the random angle being between 0 and 0.5 degrees; and generating a reconstructed image by combining, by the image processing circuit, the transmitted portions using a constrained wavelet inference on a finite kernel space-time window, the transmitted portion of each respective one of the plurality of image sensors that is combined to generate the reconstructed image being less than all of the respective raw images.

* * * * *